US011488334B2

(12) United States Patent
Grodzki

(10) Patent No.: US 11,488,334 B2
(45) Date of Patent: Nov. 1, 2022

(54) METHOD FOR OPERATING A MAGNETIC RESONANCE APPARATUS, MAGNETIC RESONANCE APPARATUS, COMPUTER PROGRAM AND ELECTRONICALLY READABLE DATA STORAGE MEDIUM

(71) Applicant: Siemens Healthcare GmbH, Erlangen (DE)

(72) Inventor: David Grodzki, Erlangen (DE)

(73) Assignee: Siemens Healthcare GmbH, Erlangen (DE)

(*) Notice: Subject to any disclaimer, the term of this patent is extended or adjusted under 35 U.S.C. 154(b) by 2 days.

(21) Appl. No.: 17/139,274

(22) Filed: Dec. 31, 2020

(65) Prior Publication Data

US 2021/0209820 A1 Jul. 8, 2021

(30) Foreign Application Priority Data

Jan. 3, 2020 (DE) .................. 102020200015.8

(51) Int. Cl.
*G06T 11/00* (2006.01)
*G01R 33/48* (2006.01)
(Continued)

(52) U.S. Cl.
CPC ........ *G06T 11/008* (2013.01); *G01R 33/4818* (2013.01); *G01R 33/50* (2013.01);
(Continued)

(58) Field of Classification Search
CPC .............. G01R 33/4818; G01R 33/50; G01R 33/5608; G06T 2210/41; G06T 11/006; G06T 11/008; G06T 3/4007
See application file for complete search history.

(56) References Cited

U.S. PATENT DOCUMENTS 11,002,815 B2 * 5/2021 Wang ............... G01R 33/56554
2015/0268316 A1 * 9/2015 Seethamraju ...... G01R 33/4816
324/309
(Continued)

FOREIGN PATENT DOCUMENTS

DE 102019204151 A1 10/2020

OTHER PUBLICATIONS

Robson, M.D. and Bydder, G.M.: Clinical ultrashort echo time imaging of bone and other connective tissues. In: NMR in Biomedicine, 2006, vol. 19, S. 765-780.—ISSN 099-1492.
(Continued)

*Primary Examiner* — Gregory H Curran
(74) *Attorney, Agent, or Firm* — Banner & Witcoff Ltd.

(57) ABSTRACT

In a method for operating a magnetic resonance (MR) apparatus, MR raw-data is acquired from an acquisition region of a patient for a sampling region of k-space using a MR sequence that employs ultrashort echo times; a first MR image dataset is reconstructed from the MR raw-data of the k-space region; a second MR image dataset is reconstructed from the MR raw-data in a central subregion of the sampling region in k-space; a resolution of the second MR image dataset is interpolated to increase the resolution of the second MR image dataset to a resolution of the first magnetic resonance image dataset; and the first and second MR image datasets are combined to obtain an output MR image dataset.

17 Claims, 3 Drawing Sheets

(51) Int. Cl.
*G01R 33/50* (2006.01)
*G06T 3/40* (2006.01)
*G01R 33/56* (2006.01)

(52) U.S. Cl.
CPC ........ *G01R 33/5608* (2013.01); *G06T 3/4007* (2013.01); *G06T 11/006* (2013.01); *G06T 2210/41* (2013.01)

(56) References Cited

U.S. PATENT DOCUMENTS

| | | |
|---|---|---|
| 2015/0369893 A1 | 12/2015 | Takeshima |
| 2017/0254869 A1 | 9/2017 | Miyazaki et al. |
| 2020/0126213 A1* | 4/2020 | Wheaton ............... G06T 7/0012 |
| 2020/0309881 A1 | 10/2020 | Grodzki |

OTHER PUBLICATIONS

David M. Grodzki et al; "Ultrashort echo time imaging using pointwise encoding time reduction with radial acquisition (PETRA)"; Magn. Reson. Med.67: 510-518; DOI: 10.1002/mrm.23017; 2011.
German Action dated Nov. 9, 2020, Application No. 10 2020 200 015.8.

* cited by examiner

METHOD FOR OPERATING A MAGNETIC RESONANCE APPARATUS, MAGNETIC RESONANCE APPARATUS, COMPUTER PROGRAM AND ELECTRONICALLY READABLE DATA STORAGE MEDIUM

CROSS REFERENCE TO RELATED APPLICATIONS

This patent application claims priority to German Patent Application No. 102020200015.8, filed Jan. 3, 2020, which is incorporated herein by reference in its entirety.

BACKGROUND

Field

The disclosure relates to a computer-implemented method for operating a magnetic resonance apparatus, wherein magnetic resonance raw-data from an acquisition region of a patient is acquired for a sampling region of k-space by means of a magnetic resonance sequence that employs ultrashort echo times, and a first magnetic resonance image dataset is reconstructed from the magnetic resonance raw-data of the k-space region. The disclosure also relates to a magnetic resonance apparatus, to a computer program and to an electronically readable data storage medium.

Related Art

Magnetic resonance apparatuses, in particular for use in medical imaging, are already widely known in the prior art, and therefore it may be said that magnetic resonance imaging is now established in the medical sector. Magnetic resonance imaging involves placing the subject to be scanned, for instance a patient, in a strong homogeneous magnetic field, for example of 3 Tesla or 7 Tesla, after which radiofrequency pulses in a magnetic resonance sequence are used to excite the nuclear spins in the region under examination. The excitation is followed by a relaxation process, which concerns both the magnetization in the direction of the main magnetic field and the transverse component. The relaxation in the direction of the main magnetic field is characterized by the T1 relaxation time; the relaxation of the transverse component of the magnetization is characterized by the T2 relaxation time, referred to below also as the T2 time for short. Inhomogeneities in the main magnetic field amplify the tissue-specific interactions during the relaxation of the transverse magnetization, leading to more rapid dephasing and hence shortening of the T2 relaxation, which results in a measurable relaxation time known as the T2* relaxation time.

Spin echo sequences (SE sequences) and gradient echo sequences (GRE) use additional radiofrequency pulses or additional gradient pulses to counteract a reduction in signal, in particular with the aim of reversing the spins. Such magnetic resonance sequences do not correct for any inhomogeneity in the main magnetic field, however, and therefore the T2* relaxation time is measured. In addition to the types of magnetic resonance sequences mentioned that produce an echo, there are also magnetic resonance sequences that measure the magnetic resonance raw-data directly in the free induction decay (FID) after the excitation pulse without an echo being produced. This immediate measurement makes it possible to measure, and to represent as an image, also magnetic resonance signals from materials of the human body that have extremely short T2 times (and thus accordingly T2* times).

This is done using what are known as magnetic resonance sequences having ultrashort echo times, where an ultrashort echo time shall be understood to mean in the present case an echo time (TE) that is shorter than 500 µs. In contrast with the use of conventional magnetic resonance sequences, which employ echo times of significantly above one millisecond, for instance, after which time the magnetic resonance signal from materials having very short T2 and T2* times cannot be measured, it is possible to use magnetic resonance sequences that have ultrashort echo times to represent such materials. Examples of such materials include bones, tendons, ligaments, teeth, pulmonary tissue, and the like.

Examples of magnetic resonance sequences that have ultrashort echo times are the UTE sequence (UTE—Ultrashort Echo Time), the PETRA sequence (PETRA—Pointwise Encoding Time Reduction with Radial Acquisition) and the zTE sequence (zTE—zero Echo Time). In magnetic resonance sequences that use ultrashort echo times, the acquisition of the magnetic resonance raw-data from the k-space sampling region to be sampled is performed radially outwards from the center of k-space. For materials that have very short T2 times, the magnetic resonance signal is already decaying during the acquisition of an FID, or during the sampling of a k-space line running outwards from the center of k-space, and therefore the magnetic resonance signal from these materials is significantly higher in the center of k-space at the start of the sampling than in the outer regions of the sampling region in k-space, where, depending on the length of the readout (RO) interval, they may even have decayed entirely already.

The fact that the magnetic resonance signal from materials having short T2 times is significantly stronger in the center of k-space than in the outer regions of the sampled k-space, where it may already have decayed, means that the magnetic resonance signals from such materials have a poor point spread function (PSF), and therefore "smearing" may arise in a resultant magnetic resonance image dataset.

In order to reduce this effect, a higher readout bandwidth (BW) can be chosen, resulting in a faster readout of the k-space sampling region and a reduction in the decay of the magnetic resonance signal during the readout interval. With a higher readout bandwidth comes a fall in the signal-to-noise ratio (SNR), however, which is a problem for materials having very short T2 times, which often accompany a comparatively low proton density.

The subsequently published German patent application DE 10 2019 204 151.5 proposes an automated adjustment method for magnetic resonance imaging using ultrashort echo times, which method seeks to define optimized values for echo time and bandwidth on the basis of an image-signal simulation, which is based on determined protocol parameters, where the signal-to-noise ratio (SNR) and the point spread function (PSF) are meant to be used as the optimization criteria. In other words, this method seeks to determine for a measurement having a given T2 time an optimum for the echo time and the bandwidth.

BRIEF DESCRIPTION OF THE DRAWINGS/FIGURES

The accompanying drawings, which are incorporated herein and form a part of the specification, illustrate the embodiments of the present disclosure and, together with the description, further serve to explain the principles of the embodiments and to enable a person skilled in the pertinent art to make and use the embodiments.

FIG. 1 is a flowchart of a method according to an exemplary embodiment of the disclosure.

Figure 1:
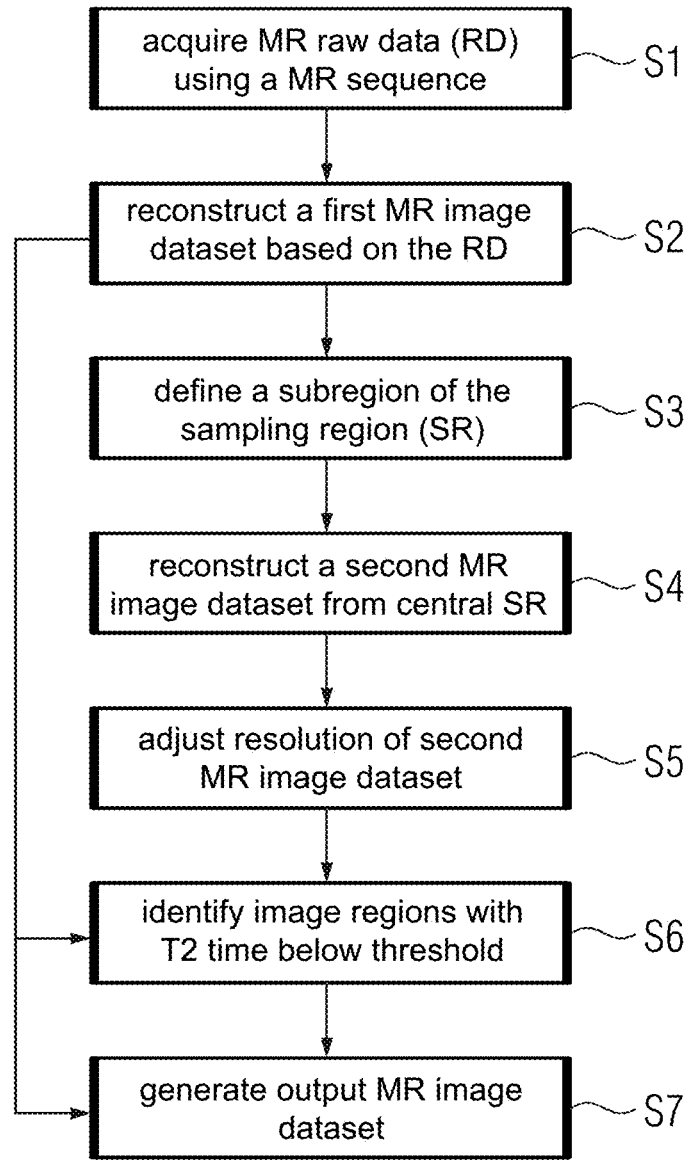

The exemplary embodiments of the present disclosure will be described with reference to the accompanying drawings. Elements, features and components that are identical, functionally identical and have the same effect are—insofar as is not stated otherwise—respectively provided with the same reference character.

DETAILED DESCRIPTION

In the following description, numerous specific details are set forth in order to provide a thorough understanding of the embodiments of the present disclosure. However, it will be apparent to those skilled in the art that the embodiments, including structures, systems, and methods, may be practiced without these specific details. The description and representation herein are the common means used by those experienced or skilled in the art to most effectively convey the substance of their work to others skilled in the art. In other instances, well-known methods, procedures, components, and circuitry have not been described in detail to avoid unnecessarily obscuring embodiments of the disclosure. The connections shown in the figures between functional units or other elements can also be implemented as indirect connections, wherein a connection can be wireless or wired. Functional units can be implemented as hardware, software or a combination of hardware and software.

An object of the disclosure is to define a way of improving the point spread function of materials having very short T2 times that does not involve increasing the bandwidth and is easy to implement, in particular without additional measurement complexity.

In a method of the type mentioned in the introduction, according to the disclosure a second magnetic resonance image dataset is reconstructed from the magnetic resonance raw-data in a central subregion of the sampling region in k-space, the initially lower resolution of the second magnetic resonance image dataset is increased by interpolation to the resolution of the first magnetic resonance image dataset, and an output magnetic resonance image dataset is obtained by combining the first and second magnetic resonance image datasets.

Thus the disclosure proposes, in addition to the normal reconstruction of a first magnetic resonance image dataset from all the magnetic resonance raw-data from the k-space sampling region, i.e. the sampled portion of k-space, to calculate at least one further, second magnetic resonance image dataset, the k-space of which is not filled completely but only up to certain maximum k-space values, which define the subregion. The missing spatial-domain information, since the second magnetic resonance image dataset is formed initially at a lower resolution, is obtained by interpolation, allowing this image result to be combined with the original image result.

In the method, initially magnetic resonance raw-data from an acquisition region of a patient is acquired in a sampling region of k-space using a magnetic resonance sequence having an ultrashort echo time. In this process, the sampling is performed radially outwards from the center of k-space. K-space is filled in the usual manner in the sampling region, and the first magnetic resonance image dataset is reconstructed in the manner known in the prior art. As already explained in the introduction, magnetic resonance signals from materials having very short T2 times have already decayed in the outer regions of the sampling region at the time of sampling, and therefore these high spatial frequencies are lost to the reconstruction, and the signal from these materials allows only a blurred reconstruction i.e. having a poor point spread function (PSF).

It is therefore proposed to reduce in size the sampled k-space for a second reconstruction, i.e. to select a subregion of the sampling region by "capping" the problematic outer regions, thereby omitting the associated magnetic resonance raw-data from the reconstruction of the second magnetic resonance image dataset. Once the second magnetic resonance image dataset has been reconstructed, the original spatial-domain resolution (of the first magnetic resonance image dataset) is restored by interpolation. Interpolation techniques for increasing the resolution of an image are widely known in the prior art, where preferably an interpolation algorithm can be used that is adaptive at least in part, in particular with regard to edge preservation, although known non-adaptive interpolation algorithms can also be employed, for instance nearest neighbor algorithms, bilinear interpolation algorithms, bicubic interpolation algorithms, spline interpolation algorithms, and such like. The interpolation preferably takes into account a large number of adjacent pixels in order to obtain as accurate an interpolation as possible and thus an increase in the resolution.

The second magnetic resonance image dataset, which is created by interpolation, has the advantage that the decay of the T2 magnetic resonance signal is avoided in part, because it is lower inside the smaller k-space, i.e. inside the subregion. In other words, k-space regions in which there is strong decay of the magnetic resonance signal are not included in the reconstruction of the second magnetic resonance image dataset, and therefore the resultant image, even though the resolution has been achieved by interpolation, allows better resolution of materials having very short T2 times than is possible in the conventionally obtained first magnetic resonance image dataset. The PSF of materials having short T2 times is therefore generally higher in the second magnetic resonance image dataset than in the first magnetic resonance image dataset.

As presented in greater detail below, these improvements can be preferably at least largely adopted by combining the first magnetic resonance image dataset and the second magnetic resonance image dataset into an output magnetic resonance image dataset, so that ultimately an image is obtained in which materials having a very short T2 time can be represented in an improved manner.

Thus a method is provided that can be used to improve the image quality and the point spread function in measurements using ultrashort echo times for materials having very short T2 times. The disclosure is based on reconstructing a smaller subregion rather than including in the calculation the outer regions of k-space, during the sampling of which the magnetic resonance signal may already have decayed, and restoring the resolution by interpolation, for instance in the image domain. In addition, the present disclosure can be applied for every magnetic resonance sequence having ultrashort echo times without the measurement time being prolonged or additional measurements.

Magnetic resonance sequences that can be employed in the context of the present disclosure include in particular the UTE sequence, the PETRA sequence, and the zTE sequence.

In a specific embodiment of the disclosure, it can be provided that the subregion includes 30 to 70%, preferably 50%, of the sampling region, and/or is defined by a symmetrical reduction in size, in particular with respect to the center of k-space, in all directions of k-space. It is possible, for example, to specify certain maximum values, usually absolute values, for the spatial frequencies in the different directions of k-space, where for instance with regard to radial sampling prior to regridding to a Cartesian system, a circle radius can also be used to define the subregion. The subregion extends about the center of k-space preferably in the same geometry as the sampling region to give a symmetrical reduction in size in all directions of k-space. A reduction in size by 50% has the advantage here of halving the resolution, to which established interpolation algorithms can be applied particularly easily.

The size of the subregion can be selected expediently according to a T2 time of a material to be depicted in the output magnetic resonance image dataset. For example, it is thus possible to define the subregion such that only a certain degree of decay in the magnetic resonance signal resulting from a very short T2 time has occurred before the associated sampling takes place. It is already possible according to procedures known in the prior art to determine readily times at which certain points in k-space are sampled during a readout interval, cf. for example the article by Grodzki et al., "Ultrashort Echo Time Imaging Using Pointwise Encoding Time Reduction With Radial Acquisition (PETRA)", Magnetic Resonance in Medicine 61: 510-518 (2012), for instance FIG. 2 therein.

As already mentioned, radial sampling of k-space, i.e. of the sampling region, takes place in the present disclosure. In this case, the subregion can be defined before regridding, in particular can be defined as a circle or an ellipse about the center of k-space. Since regridding is often oriented towards the sparsely occupied outer regions of k-space, in this case of the sampling region, it can also be expedient in the context of the present disclosure to use a smaller cell size in regridding the subregion than when regridding the entire sampling region, because here, unlike the outer regions of the subregion, there is denser sampling of k-space. Any loss in information that may take place for the subregion can thereby be kept to a lower level potentially.

Combining the first and second magnetic resonance image datasets can be performed at least in part by in particular weighted averaging in the spatial domain or in k-space.

In a first, simple embodiment, increasing the image quality with regard to materials having very short T2 times can even be accomplished by a simple average of the first magnetic resonance image dataset and the second magnetic resonance image dataset in the spatial domain. If additional information is available, it is also even possible in this case to use weighted averaging, in particular pixel-dependent weighted averaging. Averaging in k-space is also conceivable, however, for which purpose, in particular depending on interpolation techniques, the interpolated second magnetic resonance image dataset can be transformed back again into k-space, and combined there with the original k-space, which was not reduced in size, i.e. with the original magnetic resonance raw-data from the entire sampling region.

As regards the weighting, it can be provided particularly advantageously that the weighting is selected according to a segmentation result of the first and/or second magnetic resonance image dataset, said segmentation result in particular being based on at least one material to be represented in the output magnetic resonance image dataset, which material has a T2 time that lies below a threshold value, and/or being determined on the basis of a T2 time that lies below the threshold value. In other words, when the locations are known of materials having very short T2 times, heavy weighting can be given to the second magnetic resonance image dataset in these regions, while heavier weighting is given to the first magnetic resonance image dataset in other regions.

It is also conceivable in the context of the present disclosure, however, that the first and/or second magnetic resonance image dataset is segmented on the basis of at least one material to be represented in the output magnetic resonance image dataset, the T2 time of which material lies below a threshold value, and/or on the basis of a T2 time that lies below the threshold value, wherein for image regions comprising the material and/or a material having a T2 time that lies below the threshold value, the image data from the second magnetic resonance image dataset is used in the output magnetic resonance image dataset. It can be expedient in this context if the image data from the first magnetic resonance image dataset and/or a weighted combination is used outside said image regions. In other words, image regions containing materials or substances that have a very short T2 time are identified so that segmentation is possible. Thus regions in which there is no short T2 time and for which the signal has not decayed in the outer regions of the sampling region can be used from the first magnetic resonance image dataset, and in image regions having a very short T2 time, the image data from the interpolated second magnetic resonance image dataset can be used.

In all cases in which segmentation is meant to be performed with regard to short T2 times, it is possible to achieve this particularly advantageously on the basis of the first and second magnetic resonance datasets. Thus it can be provided specifically that the segmentation is performed at least in part using a pixel-by-pixel comparison of the first and second magnetic resonance image datasets. Specifically, the two magnetic resonance image datasets can be compared with one another pixel by pixel, since it can be assumed that image regions having very short T2 times are represented both more brightly and more sharply in the interpolated second magnetic resonance image dataset. This allows particularly advantageous segmentation of the image regions, which are relevant to the successful combination of the first and second magnetic resonance image datasets, which combination enhances the image quality.

In exemplary embodiments of the present disclosure, the output magnetic resonance image dataset can be provided at an interface and/or displayed and/or input to further analysis, for instance in order to determine an attenuation map (μ map), in particular in connection with PET attenuation correction. In addition, the output magnetic resonance image dataset also allows an improved representation of materials having very short T2 (and T2*) times, for instance materials such as bones, tendons, ligaments, teeth, pulmonary tissue, and such like, with the result that in particular also a diagnostic benefit is possible, in particular in orthopedics.

The present disclosure relates not only to the method but also to a magnetic resonance apparatus having a controller which is designed to perform a method according to the disclosure and comprises at least one processor and at least one storage means. All the statements relating to the method according to the disclosure can be applied analogously to the magnetic resonance apparatus according to the disclosure, and therefore the aforementioned advantages can likewise be achieved by said apparatus.

In an exemplary embodiment, the controller can comprise for example:
- a generally known sequence unit for controlling the other components of the magnetic resonance apparatus for the purpose of acquiring the magnetic resonance raw-data by means of magnetic resonance sequences that use ultrashort echo times;
- a reconstruction unit for reconstructing the first and second magnetic resonance image datasets;
- a definition unit for defining the subregion;
- an interpolation unit for adjusting the resolution of the second magnetic resonance image dataset to the resolution of the first magnetic resonance image dataset;
- a combination unit for determining the output magnetic resonance image dataset from the first and second magnetic resonance image datasets; and
- an interface for outputting the output magnetic resonance image dataset.

A computer program according to the disclosure can be loaded, for example, directly into a memory of a controller of a magnetic resonance apparatus, and has program means to perform the steps of a method according to the disclosure when the computer program is executed in the controller of the magnetic resonance apparatus. The computer program can be stored on an electronically readable data storage medium according to the disclosure, which therefore comprises electronically readable control information stored thereon that comprises at least one computer program according to the disclosure and is designed such that it performs a method according to the disclosure when the data storage medium is used in a controller of a magnetic resonance apparatus. In an exemplary aspect, the electronically readable data storage medium according to the disclosure is a non-transient data storage medium, for instance a CD-ROM.

FIG. 1 shows a flowchart of a method according to an exemplary embodiment of the disclosure, in which by means of a magnetic resonance sequence that uses ultrashort echo times (TE), an acquisition region of a patient, which region contains materials having a very short T2 time, is meant to be acquired in such a way that the materials having a very short T2 time, so in particular lying below a threshold value, can nonetheless be discerned well and in high quality. Specifically, for example, a UTE sequence, a PETRA sequence or a zTE sequence can be used as the magnetic resonance sequence.

In step S1, magnetic resonance raw-data is conventionally acquired using the magnetic resonance sequence, where the portion of k-space which is sampled radially in this case shall be referred to as the sampling region of k-space. A property of the radial sampling of the sampling region, which sampling starts at the center of k-space, is that for sample points lying in the outer regions of the sampling region, the T2 magnetic resonance signal may already have decayed within the readout interval for materials that have T2 times lying below the threshold value.

Therefore after reconstruction of a first magnetic resonance image dataset in a step S2 using all acquired magnetic resonance raw-data, i.e. for the sampling region, as is generally known, the reconstruction of a second magnetic resonance image dataset, in which the materials having a very short T2 time are better represented, is prepared in a step S3 by defining a subregion of the sampling region. The portion of the sampling region that includes the subregion can lie in the range of 30 to 70% of the sampling region, for example, preferably at 50% of the sampling region, although advantageously can also be selected according to the aforementioned threshold value or a T2 time of one of said materials. This is defined by a symmetrical reduction in size in all directions of k-space, thus in particular by defining maximum absolute values of the spatial frequencies. In the present case, the subregion is defined in a sampling region that has been regridded from the radial sampling onto a Cartesian sampling pattern, for which sampling region this process is explained in more detail in FIGS. 2 and 3.

Figure 2:
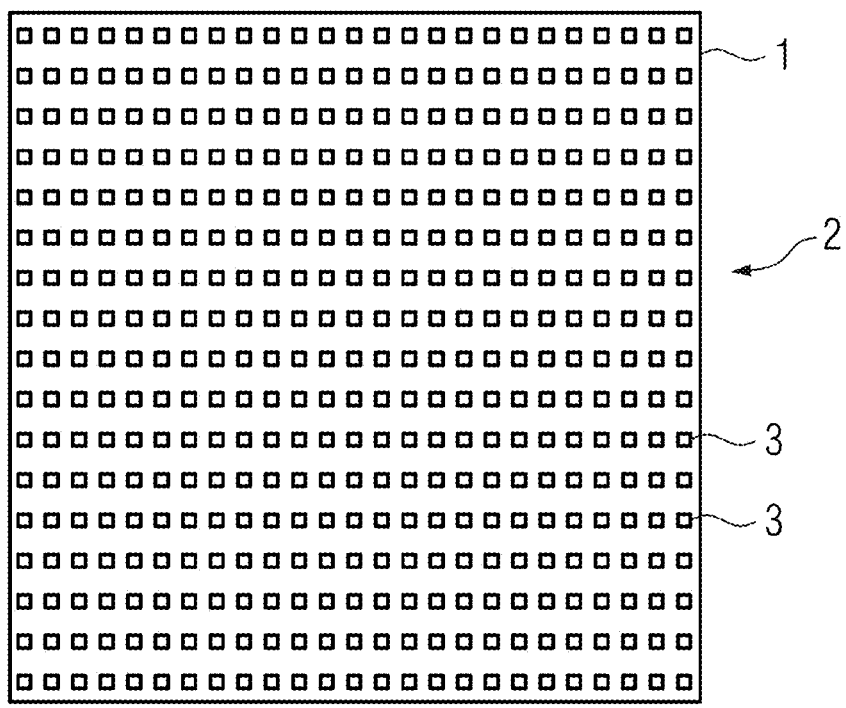
FIG. 2 shows a sampling region in k-space according to an exemplary embodiment.
Figure 3:
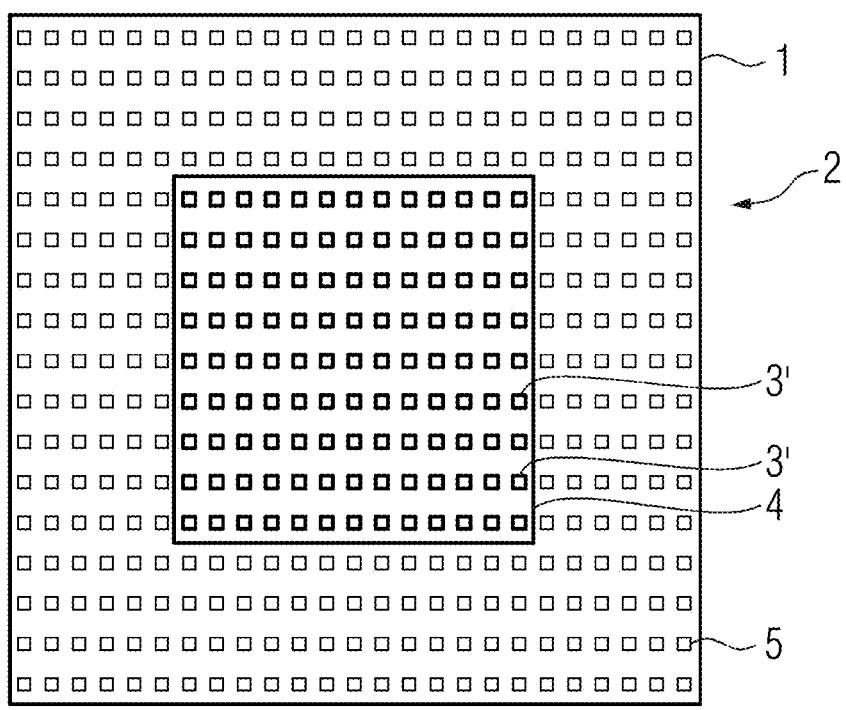
FIG. 3 shows the definition of a subregion in k-space according to an exemplary embodiment.

FIG. 2 shows an example of a sampling region 1, i.e. a sampled portion of k-space 2, containing corresponding sample points 3, which were obtained by regridding onto a Cartesian sampling, according to an exemplary embodiment. The subregion 4 (see FIG. 3) is then defined centrally inside this sampling region 1, and only the magnetic resonance raw-data available at sample points 3' inside the subregion 4 is used to reconstruct the second magnetic resonance image dataset in step S4 (see FIG. 1), which raw data is acquired at a time when the magnetic resonance signal of the materials having a very short T2 time had not yet decayed or decayed only to a certain degree.

Returning to FIG. 1, the second magnetic resonance image dataset, which was reconstructed in step S4, is of lower resolution in the spatial domain because of using only the subregion 4, and therefore, in a step S5, the resolution is correspondingly adjusted by interpolation to the resolution of the first magnetic resonance image dataset, which was reconstructed in step S2 from all the magnetic resonance raw-data of the sampling region 1.

In an optional step S6 of this exemplary embodiment, by comparing the interpolated second magnetic resonance image dataset and the first magnetic resonance image dataset, image regions are identified in which materials are present that have a T2 time lying below the threshold value. A pixel-by-pixel comparison is performed in this process, because it can be assumed that the image regions containing materials of very short T2 time are of greater brightness and/or have better edge definition as a result of disregarding the outer regions 5 of the sampling region 1, which are measured at a time when the T2 magnetic resonance signal had already decayed.

This segmentation information from step S6 can be used in a step S7, in which the first magnetic resonance image dataset and the interpolated second magnetic resonance image dataset are combined to form an output magnetic resonance image dataset either in such a way, in order to achieve location-dependent weighting when combining the magnetic resonance image datasets, that the second magnetic resonance image dataset is weighted higher in regions containing materials having very short T2 times, and the first magnetic resonance image dataset is weighted higher outside these image regions, or even in such a way that only image data from the second magnetic resonance image dataset is used in image regions in which very short T2 times exist, and in particular only image data from the first magnetic resonance image dataset is used outside these image regions. In all cases, an output magnetic resonance image dataset is produced in which the image quality is improved for materials that have a T2 time lying below the threshold value.

Figure 4:
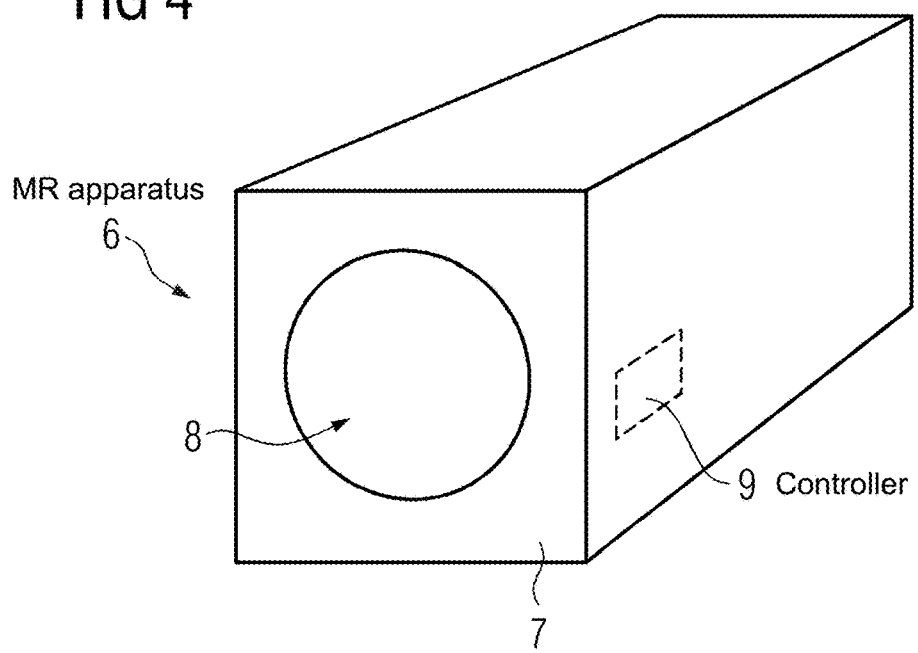
FIG. 4 shows a magnetic resonance apparatus according to an exemplary embodiment of the disclosure.

FIG. 4 shows a block diagram of a magnetic resonance apparatus 6 according to an exemplary embodiment of the disclosure. The apparatus 6, as is generally known, includes a scanner, having a main magnetic unit 7 for the main magnet, which generates the main magnetic field. The main magnet unit 7 defines a patient placement area 8, into which the patient can be moved using a patient couch (not shown here) in order to acquire magnetic resonance raw-data. A radiofrequency coil arrangement and a gradient coil arrangement, for example, can be provided, as is generally known, surrounding the patient placement area 8.

Figure 5:
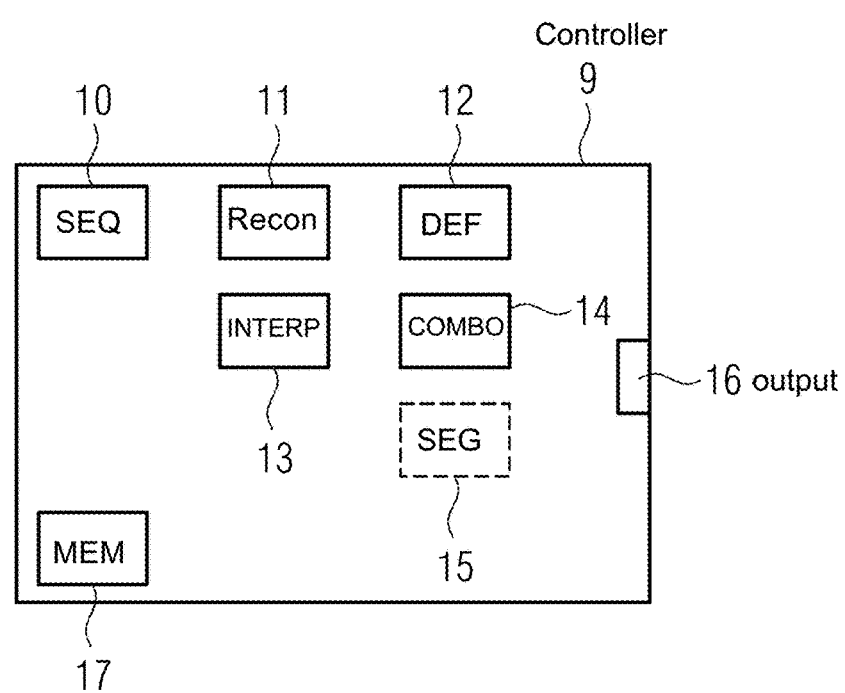
FIG. 5 shows the controller, according to an exemplary embodiment, of the magnetic resonance apparatus of FIG. 4.

The operation of the magnetic resonance apparatus 6 is controlled by a controller 9, which is designed to implement the method according to the disclosure and whose functional design is described in greater detail in FIG. 5.

In an exemplary embodiment, the controller 9 comprises, as is generally known, a sequence unit (sequencer) 10, which can be used to acquire magnetic resonance raw-data in accordance with specific magnetic resonance sequences, and therefore is also configured to perform step S1. A reconstruction unit (reconstructor) 11 can be used to reconstruct the first magnetic resonance image dataset in step S2 and the second magnetic resonance image dataset in step S4. A definition unit (definer) 12 defines the subregion 4 to which the reconstruction of the second magnetic resonance image dataset is meant to be confined, and therefore it can perform step S3 in the method of FIG. 1.

The controller 9 also comprises an interpolation unit (interpolator) 13 for performing step S5 of FIG. 1 and a combination unit (combiner) 14 for performing step S7 of FIG. 1, i.e. to combine the first and second magnetic resonance image datasets to form the output magnetic resonance image dataset, which can be provided via the output interface 16, as can also, if required, the first magnetic resonance image dataset and/or the second magnetic resonance image dataset.

The controller 9 can optionally also comprise a comparison and segmentation unit 15 for performing step S6.

In an exemplary embodiment, the function units 10 to 15 are implemented by at least one processor of the controller 9 using computer program means of a computer program according to the disclosure. In addition, the controller 9 can also comprise a storage means (memory) 17, in which can be stored temporarily or for a prolonged period, for instance the magnetic resonance raw-data, the first magnetic resonance image dataset, the second magnetic resonance image dataset and the output magnetic resonance image dataset. In an exemplary embodiment, the controller 9 (and/or one or more components/units therein) includes processor circuitry that is configured to perform one or more functions and/or operations of the controller 9 (and/or respective functions/operations of the internal components/units).

Although the disclosure has been illustrated and described in detail using the preferred exemplary embodiment, the disclosure is not limited by the disclosed examples, and a person skilled in the art can derive other variations therefrom without departing from the scope of protection of the disclosure.

To enable those skilled in the art to better understand the solution of the present disclosure, the technical solution in the embodiments of the present disclosure is described clearly and completely below in conjunction with the drawings in the embodiments of the present disclosure. Obviously, the embodiments described are only some, not all, of the embodiments of the present disclosure. All other embodiments obtained by those skilled in the art on the basis of the embodiments in the present disclosure without any creative effort should fall within the scope of protection of the present disclosure.

It should be noted that the terms "first", "second", etc. in the description, claims and abovementioned drawings of the present disclosure are used to distinguish between similar objects, but not necessarily used to describe a specific order or sequence. It should be understood that data used in this way can be interchanged as appropriate so that the embodiments of the present disclosure described here can be implemented in an order other than those shown or described here. In addition, the terms "comprise" and "have" and any variants thereof are intended to cover non-exclusive inclusion. For example, a process, method, system, product or equipment comprising a series of steps or modules or units is not necessarily limited to those steps or modules or units which are clearly listed, but may comprise other steps or modules or units which are not clearly listed or are intrinsic to such processes, methods, products or equipment.

References in the specification to "one embodiment," "an embodiment," "an exemplary embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The exemplary embodiments described herein are provided for illustrative purposes, and are not limiting. Other exemplary embodiments are possible, and modifications may be made to the exemplary embodiments. Therefore, the specification is not meant to limit the disclosure. Rather, the scope of the disclosure is defined only in accordance with the following claims and their equivalents.

Embodiments may be implemented in hardware (e.g., circuits), firmware, software, or any combination thereof. Embodiments may also be implemented as instructions stored on a machine-readable medium, which may be read and executed by one or more processors. A machine-readable medium may include any mechanism for storing or transmitting information in a form readable by a machine (e.g., a computer). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact results from computing devices, processors, controllers, or other devices executing the firmware, software, routines, instructions, etc. Further, any of the implementation variations may be carried out by a general-purpose computer.

For the purposes of this discussion, the term "processor circuitry" shall be understood to be circuit(s), processor(s), logic, or a combination thereof. A circuit includes an analog circuit, a digital circuit, state machine logic, data processing circuit, other structural electronic hardware, or a combination thereof. A processor includes a microprocessor, a digital signal processor (DSP), central processor (CPU), application-specific instruction set processor (ASIP), graphics and/or image processor, multi-core processor, or other hardware processor. The processor may be "hard-coded" with instructions to perform corresponding function(s) according to aspects described herein. Alternatively, the processor may access an internal and/or external memory to retrieve instructions stored in the memory, which when executed by the processor, perform the corresponding function(s) associated with the processor, and/or one or more functions and/or operations related to the operation of a component having the processor included therein.

In one or more of the exemplary embodiments described herein, the memory is any well-known volatile and/or non-volatile memory, including, for example, read-only memory (ROM), random access memory (RAM), flash memory, a magnetic storage media, an optical disc, erasable programmable read only memory (EPROM), and programmable read only memory (PROM). The memory can be non-removable, removable, or a combination of both.

The invention claimed is:

1. A method for operating a magnetic resonance (MR) apparatus, comprising:
    acquiring MR raw-data from an acquisition region of a patient for a sampling region of k-space using a MR sequence that employs ultrashort echo times;
    reconstructing a first MR image dataset from the MR raw-data of the k-space region;
    reconstructing a second MR image dataset from the MR raw-data in a central subregion of the sampling region in k-space;
    interpolating a resolution of the second MR image dataset to increase the resolution of the second MR image dataset to a resolution of the first magnetic resonance image dataset; and
    combining the first and second MR image datasets to obtain an output MR image dataset.

2. The method as claimed in claim 1, wherein the subregion includes 30 to 70% of the sampling region, and/or is defined by a symmetrical reduction in size in all directions of k-space.

3. The method as claimed in claim 1, wherein the subregion is defined by a symmetrical reduction in size in all directions of k-space.

4. The method as claimed in claim 3, wherein the subregion includes 50% of the sampling region.

5. The method as claimed in claim 1, wherein a size of the subregion is selected according to a T2 time of a material to be depicted in the output MR image dataset.

6. The method as claimed in claim 1, wherein the sampling region is radially sampled, the subregion being defined before regridding.

7. The method as claimed in claim 6, wherein the subregion is defined as a circle or an ellipse about a center of k-space.

8. The method as claimed in claim 6, wherein a smaller cell size is used in regridding the subregion than when regridding an entirety of the sampling region.

9. The method as claimed in claim 1, wherein the combining of the first and second MR image datasets is performed at least in part by weighted averaging in a spatial domain or in k-space.

10. The method as claimed in claim 9, wherein the combining in K k-space comprises performing a back-transformation of the interpolated second MR image.

11. The method as claimed in claim 9, wherein the weighting is selected according to a segmentation result of the first and/or second MR image dataset, the segmentation result being:
    based on at least one material to be represented in the output MR image dataset, wherein the at least one material has a T2 time that lies below a threshold value, and/or
    determined based on the T2 time that lies below the threshold value.

12. The method as claimed in claim 1, wherein the first and/or second MR image dataset is segmented based on:
    the at least one material to be represented in the output MR image dataset, the at least one material having a T2 time that lies below a threshold value, and/or
    a T2 time that lies below the threshold value, wherein for image regions comprising the at least one material and/or a material having a T2 time that lies below the threshold value, the image data from the second MR image dataset being used in the output MR image dataset.

13. The method as claimed in claim 12, wherein the image data from the first MR image dataset and/or a weighted combination is used outside the image regions.

14. The method as claimed in claim 11, wherein the segmentation is performed at least in part using a pixel-by-pixel comparison of the first and second MR image datasets.

15. A computer program product embodied on a non-transitory computer-readable storage medium and which includes a program and is directly loadable into a memory of the MR apparatus, when executed by a processor of the MR apparatus, causes the processor to perform the method as claimed in claim 1.

16. A non-transitory computer-readable storage medium with an executable program stored thereon, that when executed, instructs a processor to perform the method of claim 1.

17. A magnetic resonance (MR) apparatus comprising:
    a MR scanner; and
    a controller configured to:
        acquire, using the MR scanner, MR raw-data from an acquisition region of a patient for a sampling region of k-space using a MR sequence that employs ultrashort echo times;
        reconstruct a first MR image dataset from the MR raw-data of the k-space region;
        reconstruct a second MR image dataset from the MR raw-data in a central subregion of the sampling region in k-space;
        interpolate a resolution of the second MR image dataset to increase the resolution of the second MR image dataset to a resolution of the first magnetic resonance image dataset; and
        combine the first and second MR image datasets to obtain an output MR image dataset.

* * * * *